United States Patent
Liu et al.

(10) Patent No.: US 7,636,241 B2
(45) Date of Patent: Dec. 22, 2009

(54) HEAT DISSIPATING DEVICE

(75) Inventors: Chang-Chun Liu, Shenzhen (CN);
Xiao-Lin Gan, Shenzhen (CN);
Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 11/957,502

(22) Filed: Dec. 17, 2007

(65) Prior Publication Data
US 2009/0109629 A1   Apr. 30, 2009

(30) Foreign Application Priority Data
Oct. 31, 2007   (CN) .................. 2007 1 0202339

(51) Int. Cl.
*H05K 7/20* (2006.01)
*F28F 7/00* (2006.01)
*H01L 23/34* (2006.01)

(52) U.S. Cl. ............. 361/704; 165/80.2; 165/185; 257/707; 257/712; 257/718; 257/719; 361/707

(58) Field of Classification Search ........... 361/705, 361/708
See application file for complete search history.

(56) References Cited

U.S. PATENT DOCUMENTS

| | | | | |
|---|---|---|---|---|
| 4,546,409 A | * | 10/1985 | Yoshino et al. | 361/706 |
| 6,188,579 B1 | * | 2/2001 | Buondelmonte et al. | 361/719 |
| 6,245,442 B1 | * | 6/2001 | Towata et al. | 428/614 |
| 6,285,552 B1 | * | 9/2001 | Adachi | 361/705 |
| 6,702,007 B1 | * | 3/2004 | Pan et al. | 165/185 |
| 2007/0062676 A1 | * | 3/2007 | Yao | 165/104.33 |

* cited by examiner

*Primary Examiner*—Gregory D Thompson
(74) *Attorney, Agent, or Firm*—Frank R. Niranjan

(57) ABSTRACT

A heat dissipating device includes a heat sink, and a block. The heat sink includes a base and a plurality of fins formed on the base. A bottom portion of the base defines a first groove. The block defines a second groove in one surface of the block. The block is received in the first groove, and an electronic component is received in the second groove.

3 Claims, 3 Drawing Sheets

HEAT DISSIPATING DEVICE

BACKGROUND

1. Field of the Invention

The present invention relates to heat dissipating devices.

2. Description of Related Art

An equipment chassis, such as a computer chassis, usually includes a heat sink installed on an electronic component thereof for dissipating heat. Typically, the heat sink includes a base, and a plurality of fins formed on the base. A bottom of the base defines a groove. The electronic component is received in the groove. The base conducts heat generated by the electronic component to the fins. Unfortunately, the heat sink can't fit an electronic component whose size and shape are different from the groove of the heat sink.

What is needed, therefore, is a heat dissipating device which is able to detachably fit different electronic components.

SUMMARY

A heat dissipating device includes a heat sink, and a block. The heat sink includes a base and a plurality of fins formed on the base. A bottom portion of the base defines a first groove. The block defines a second groove in one surface of the block. The block is received in the first groove, and an electronic component is received in the second groove.

Other advantages and novel features will become more apparent from the following detailed description of embodiment when taken in conjunction with the accompanying drawings, in which:

DETAILED DESCRIPTION

Figure 1:
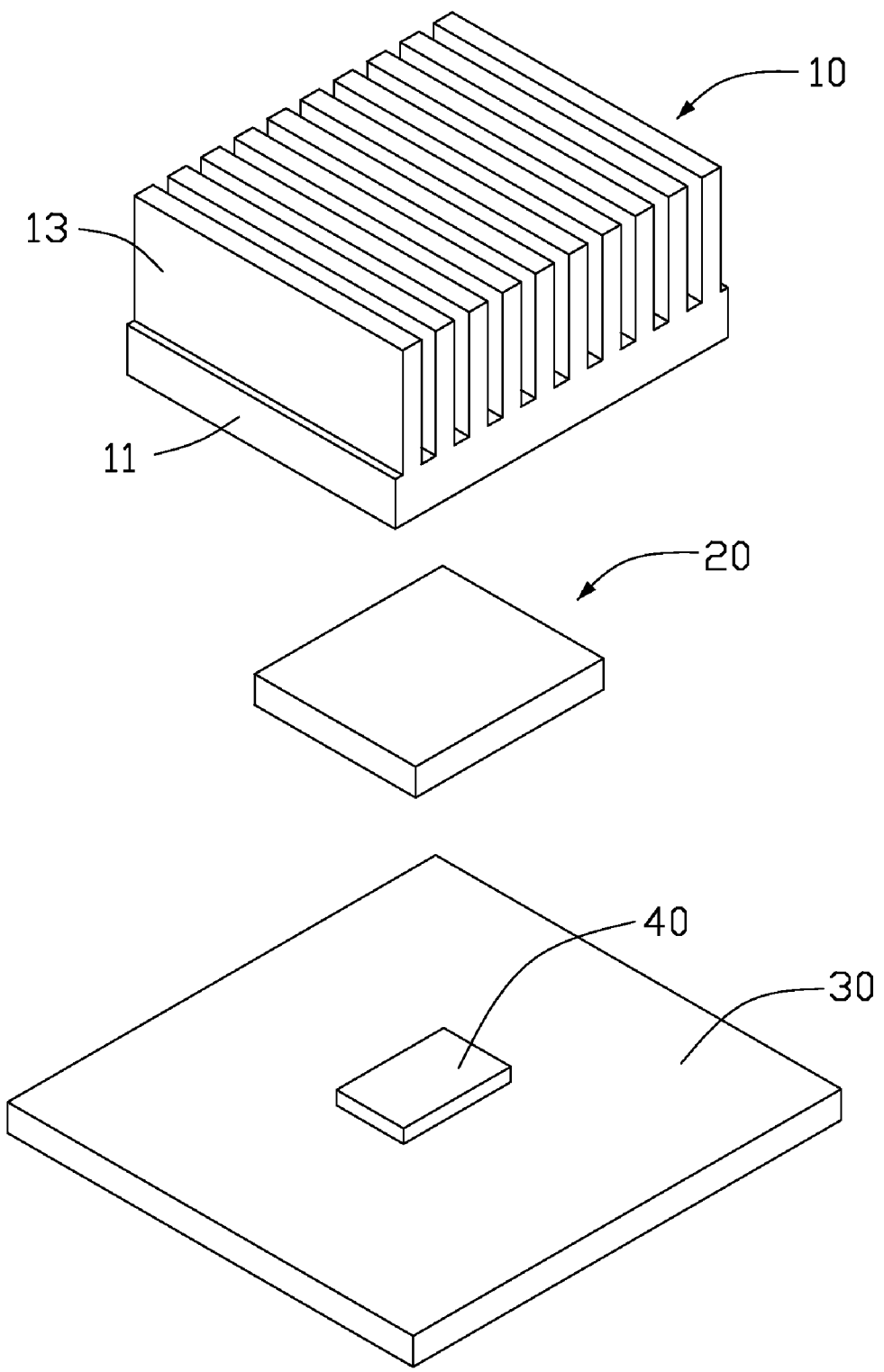
FIG. 1 is an exploded, isometric view of a heat dissipating device in accordance with an embodiment of the present invention.
Figure 2:
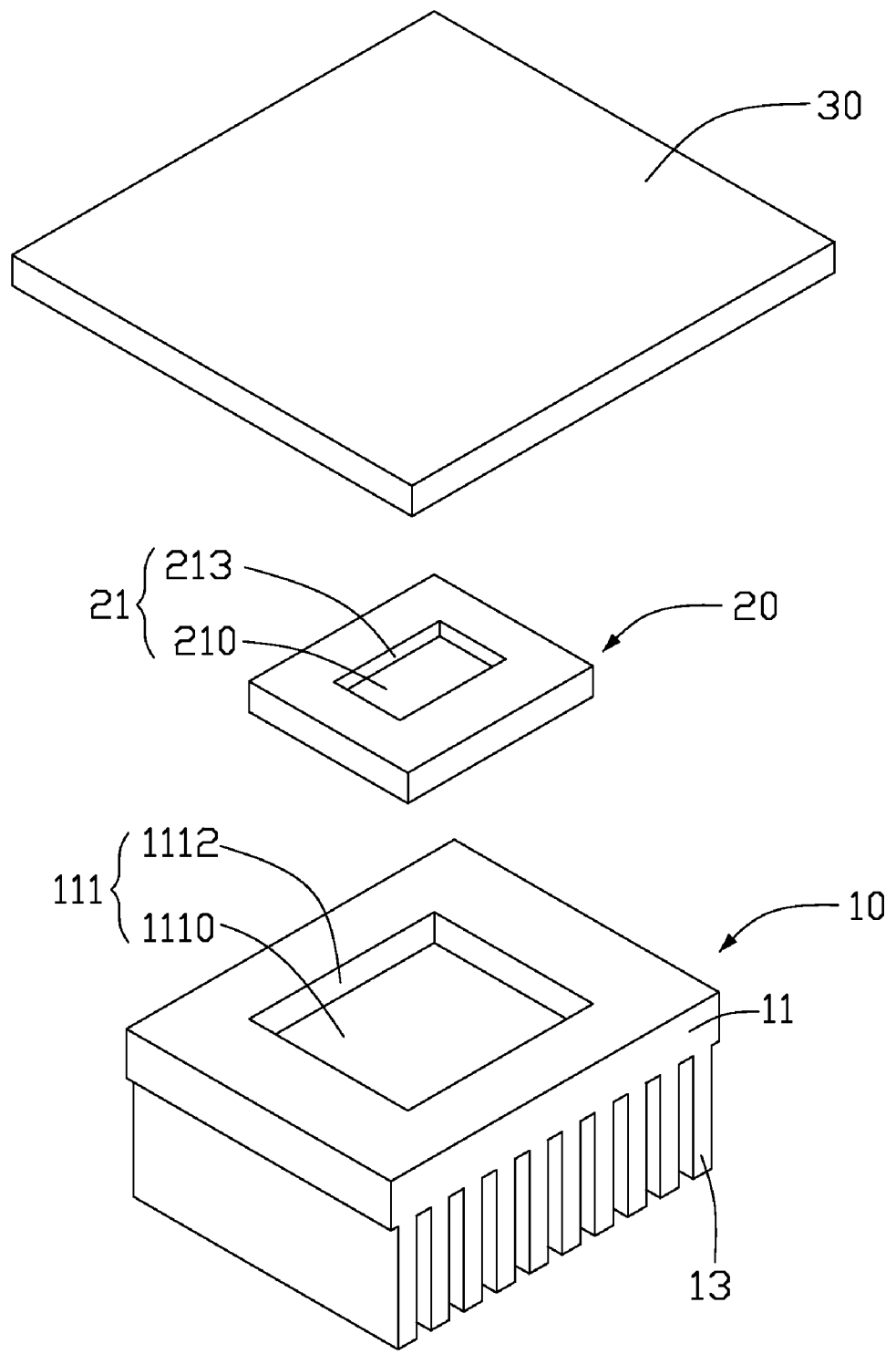
FIG. 2 is similar to FIG. 1, but viewed from another aspect.

Referring to FIGS. 1 and 2, a heat dissipating device is provided in accordance with an embodiment of the present invention for an electronic component 40 on a circuit board 30. The heat dissipating device includes a heat sink 10, and a block 20.

The heat sink 10 includes a base 11, and a plurality of fins 13 formed on the base 11. A first groove 111 is defined in the middle of a bottom portion of the base 11. The first groove 111 includes a bottom wall 1110 and four sidewalls 1112.

The block 20 is made of material having good heat conductivity. The shape and size of the block 20 is the same as the first groove 111 of the heat sink 10. A bottom portion of the block 20 defines a second groove 21 for receiving the electronic component 40. The second groove 21 includes a bottom wall 210 and four sidewalls 213.

Figure 3:
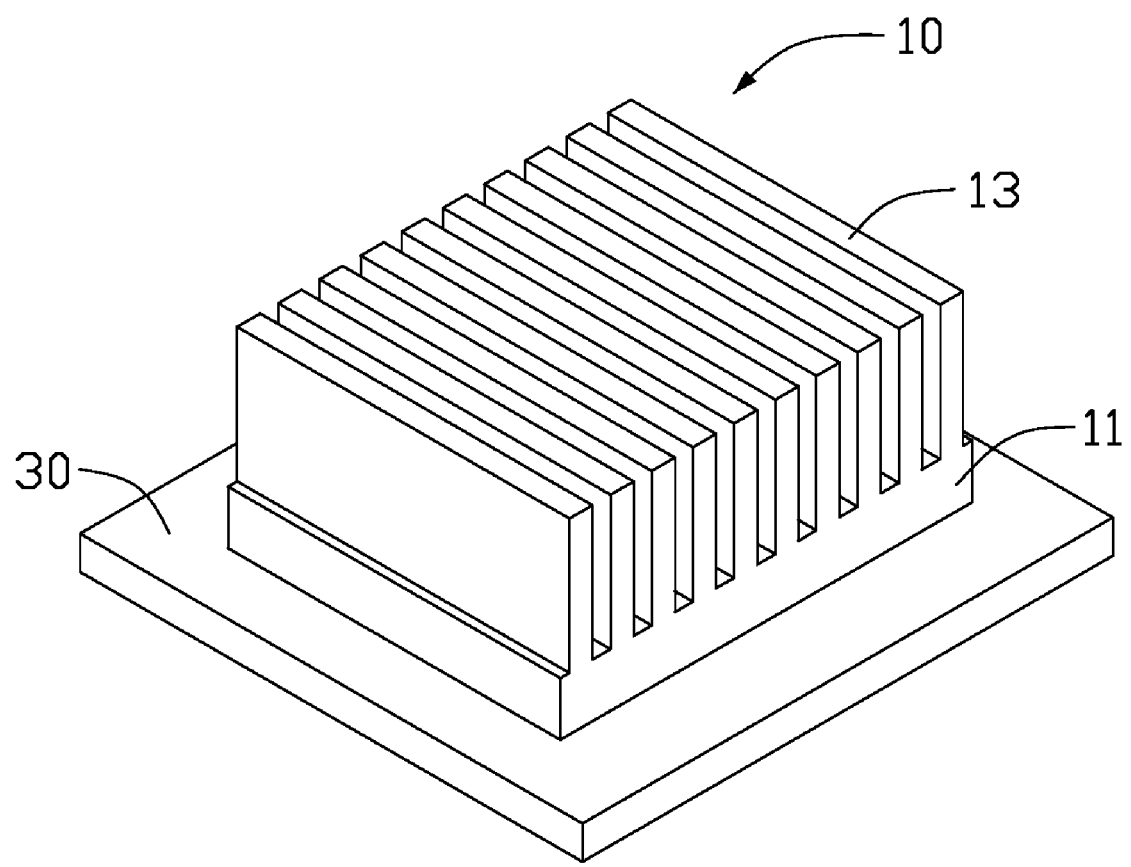
FIG. 3 is an assembled view of FIG. 1.

Referring further to FIG. 3, in assembly, the bottom wall 210, and the sidewalls 213 of the second groove 21 are coated with heat conductive paste. The block 20 is placed on the electronic component 40, with the top surface and four lateral surfaces of the electronic component 40 contacting with and adhering to the second bottom wall 210 and the sidewalls 213 of the second groove 21 respectively. The first bottom wall 1110, and the sidewalls 1112 of the first groove 111 are coated with heat conductive paste. The block 20 is received in the heat sink 10, with the top surface and four lateral surfaces contacting with and adhering to the first bottom wall 1110 and the sidewalls 1112 of the first groove 111 respectively.

When the electronic component 40 on the circuit board 30 is in use, heat generated by the electronic component 40 is conducted to the base 11 of the heat sink 10 via the block 20. Thereafter, the heat is conducted to the fins 13 of the heat sink 10 and then is dissipated by a fan mounted on the fins 13.

To fit a different electronic component, the block 20 may be replaced with another block defining a second groove having the same shape or size with that of the different electronic component, therefore it is unnecessary to change the heat sink 10 to accommodate different electronic component.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A heat dissipating device for an electronic component, the heat dissipating device comprising:
   a heat sink comprising a base and a plurality of fins formed on the base, a bottom portion of the base defining a first groove; and
   a block made of material having high heat conductivity, and detachably received in the first groove of the heat sink, the block defining a second groove for detachably receiving the electronic component therein; wherein dimensions of the block are the same as those of the first groove of the heat sink, and dimensions of the second groove of the block are the same as those of the electronic component.

2. The heat dissipating device as claimed in claim 1, wherein the first groove comprises a bottom wall and four sidewalls.

3. The heat dissipating device as claimed in claim 1, wherein the second groove comprises a bottom wall and four sidewalls.

* * * * *